United States Patent
Ching-Kooi et al.

(10) Patent No.: US 8,981,823 B1
(45) Date of Patent: *Mar. 17, 2015

(54) APPARATUS AND METHOD FOR SMART VCC TRIP POINT DESIGN FOR TESTABILITY

(71) Applicant: Spansion LLC, Sunnyvale, CA (US)

(72) Inventors: Hor Ching-Kooi, Kuala Lumpur (MY); Teoh Boon-Weng, Penang (MY); Ong Mee-Choo, Penang (MY)

(73) Assignee: Spansion LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/972,008

(22) Filed: Aug. 21, 2013

Related U.S. Application Data

(63) Continuation of application No. 13/249,069, filed on Sep. 29, 2011, now Pat. No. 8,536,908.

(51) Int. Cl.
  *H03L 7/00* (2006.01)
  *H03K 3/012* (2006.01)
  *H03K 5/24* (2006.01)

(52) U.S. Cl.
  CPC . *H03K 3/012* (2013.01); *H03K 5/24* (2013.01)
  USPC .......................................... 327/143; 327/198

(58) Field of Classification Search
  USPC ......................................... 327/142, 143, 198
  See application file for complete search history.

(56) References Cited

U.S. PATENT DOCUMENTS

| | | | |
|---|---|---|---|
| 4,283,713 A * | 8/1981 | Philipp | 341/142 |
| 5,132,937 A | 7/1992 | Tuda et al. | |
| 5,539,910 A | 7/1996 | Brueckmann et al. | |
| 7,180,301 B1 | 2/2007 | Hynes | |
| 7,327,850 B2 | 2/2008 | Crump et al. | |
| 2003/0020525 A1 | 1/2003 | Shigemasa et al. | |
| 2003/0048587 A1 | 3/2003 | Lai | |
| 2005/0184799 A1 | 8/2005 | Kii | |
| 2008/0042632 A1 | 2/2008 | Chapuis et al. | |

* cited by examiner

*Primary Examiner* — William Hernandez
(74) *Attorney, Agent, or Firm* — Sterne, Kessler, Goldstein & Fox, PLLC

(57) ABSTRACT

An apparatus and method for testing is provided. An integrated circuit includes a comparison circuit that is arranged to trip based on a power supply signal reaching a trip point. The integrated circuit also includes an analog-to-digital converter that is arranged to convert the power supply signal into a digital signal. The integrated circuit also includes a storage component that stores a digital value associated with the digital signal, and provides the power supply value at an output pin of the integrated circuit. The integrated circuit includes a latch that is coupled between the analog-to-digital converter and the storage component. The latch is arranged to open when the comparison circuit trips, such that, when the comparison circuit trips, the storage component continues to store a digital value such that the digital value corresponds to the voltage associated with the power supply signal when the comparison circuit tripped.

20 Claims, 9 Drawing Sheets

APPARATUS AND METHOD FOR SMART VCC TRIP POINT DESIGN FOR TESTABILITY

The present application is a continuation of pending U.S. patent application Ser. No. 13/249,069, filed on Sep. 29, 2001, now allowed, which is incorporated herein by reference in its entirety.

TECHNICAL FIELD

The invention is related to electronic circuitry, and in particular, but not exclusively, to an apparatus and method for providing, at one or more output and/or input/output (I/O) pins of an integrated circuit, a digital signal having a value representing the voltage of the power supply signal when the power supply signal trip point is reached for use in testing, characterization, and/or debugging.

BACKGROUND

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. An oxide-nitride-oxide (ONO) dielectric layer is formed over the top of the substrate and bit lines. The nitride serves as the charge storage layer between two insulating layers. Word lines are then formed over the top of the ONO layer perpendicular to the bit lines. Applying a voltage to the word line, acting as a control gate, along with an applied voltage to the bit line allows for the reading or writing of data from or to that location in the memory cell array. MirrorBit™ Flash memory may be applied to different architectures of flash memory, including NOR flash and NAND flash.

BRIEF DESCRIPTION OF THE DRAWINGS

Non-limiting and non-exhaustive embodiments of the present invention are described with reference to the following drawings, in which.

DETAILED DESCRIPTION

Figure 1:
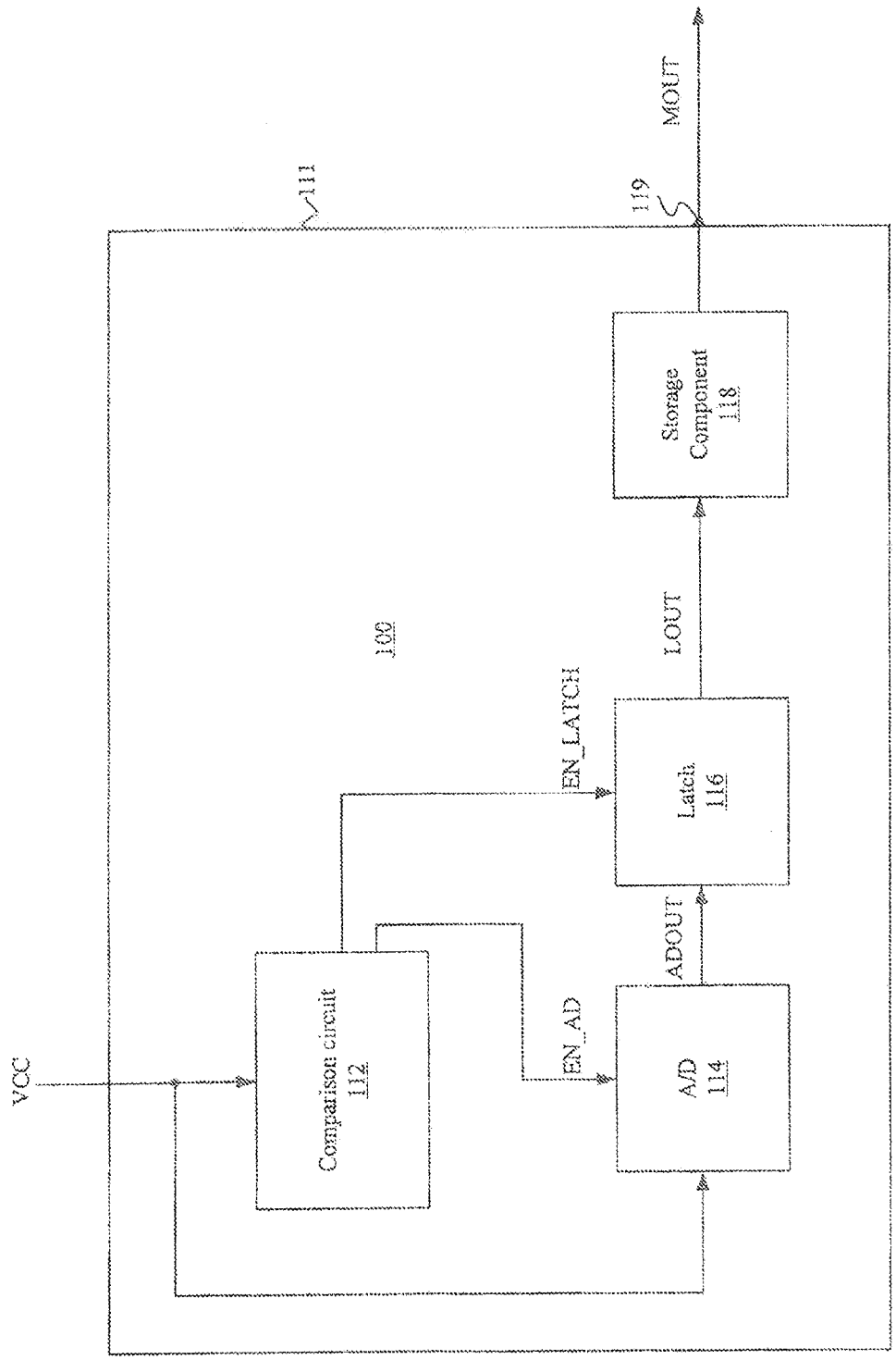
FIG. 1 illustrates a block diagram of an embodiment of an integrated circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "signal" means at least one current, voltage, charge, temperature, data, or other signal.

Briefly stated, an apparatus and method for testing includes an integrated circuit. The integrated circuit includes a comparison circuit that is arranged to trip based on a power supply signal reaching a trip point. The integrated circuit also includes an analog-to-digital converter that is arranged to convert the power supply signal into a digital signal. The integrated circuit also includes a storage component that stores a digital value associated with the digital signal, and provides the power supply value at an output pin of the integrated circuit. The integrated circuit includes a latch that is coupled between the analog-to-digital converter and the storage component. The latch is arranged to open when the comparison circuit trips, such that, when the comparison circuit trips, the storage component continues to store a digital value such that the digital value corresponds to the voltage associated with the power supply signal when the comparison circuit tripped.

FIG. 1 illustrates a block diagram of integrated circuit 111 having at least an output pin 119. Output pin 119 may include one or more output pins and/or I/O pins. Integrated circuit 111 includes device 100. In some embodiments, device 100 is a memory device, such as a flash memory, or the like. However, the scope of the invention is not so limited, and other circuits for which it may be desirable to determine the VCC trip point for purposes of testing, debugging, or characterization may be employed as an embodiment of device 100. Device 100 includes A/D converter 114, latch 116, storage component 118, and comparison circuit 112.

Comparison circuit 112 is arranged to trip based on power supply signal VCC reaching a trip point. Analog-to-digital converter 116 is arranged to convert signal VCC into a digital signal, A/D converter output signal ADOUT having a power supply value that is based on a voltage associated with power supply signal VCC. Storage component 118 is arranged to store the power supply value, and further arranged to provide the power supply value MOUT at 119. Latch 116 is coupled between analog-to-digital converter 114 and storage component 118. Latch 116 is arranged to provide latch output signal LOUT when latch 116 is closed. Latch 116 is arranged to open when comparison circuit 112 trips, such that, when comparison circuit 112 trips, storage component 118 continues to store the digital value such that the digital value corresponds to the voltage associated with power supply signal VCC when comparison circuit 112 tripped.

Figure 2:
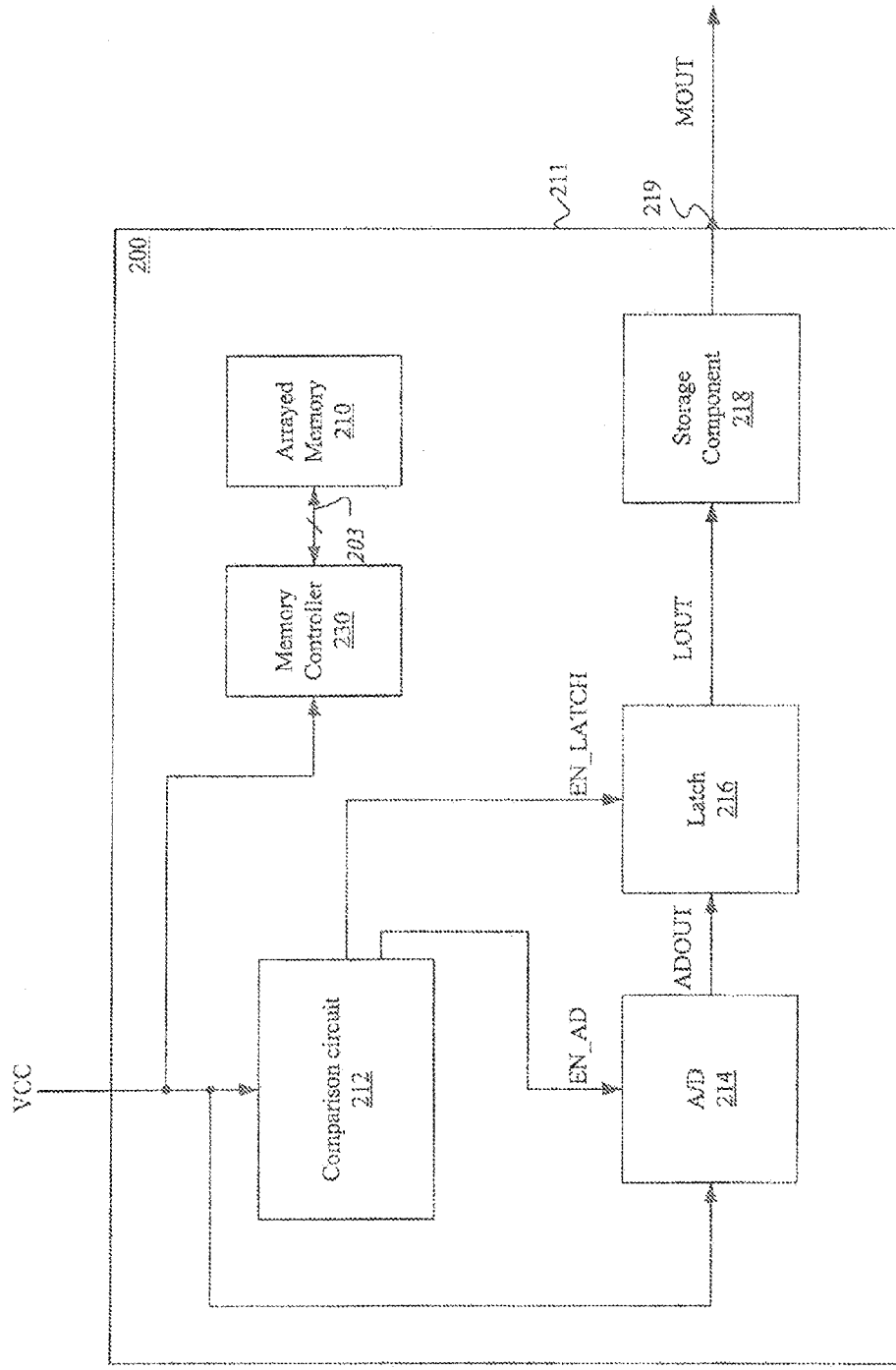
FIG. 2 shows a block diagram of an embodiment of the integrated circuit of FIG. 1 in which the integrated circuit is a memory.

FIG. 2 shows a block diagram of integrated circuit 200, which may be employed as an embodiment of integrated circuit 100 of FIG. 1 in which the integrated circuit is a memory. Device 200 is a memory device that further includes memory controller 230 and arrayed memory 203. Arrayed memory 210 includes memory sectors that can be accessed via memory controller 230.

Figure 3:
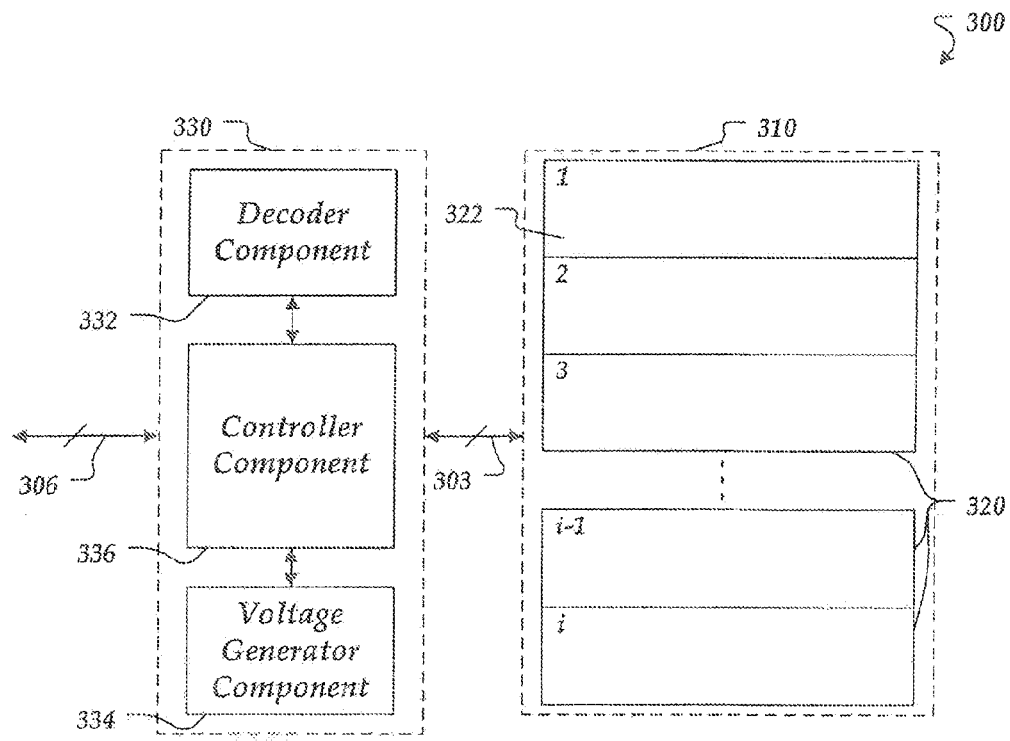
FIG. 3 illustrates a block diagram of a portion of an embodiment of the memory of FIG. 2.

FIG. 3 shows a memory environment in which embodiments of the invention may be employed. Not all the components illustrated in the figures may be required to practice the invention, and variations in the arrangement and type of the components may be made without departing from the spirit or scope of the invention. For example, although some embodiments of the invention described in the context of a MirrorBit™ NOR flash memory, the fabrication described herein may be employed in manufacturing other types of microelectronic memories or devices such as other various types of flash memory.

As shown, memory 300 includes arrayed memory 310 and memory controller 330. Memory controller 330 is arranged to communicate addressing data and program data over signal path 306. For example, signal path 306 can provide 8, 16, or more I/O lines of data. Memory controller 330 is also configured to access arrayed memory 310 over signal path 303. For example, memory controller 330 can read, write, erase, and perform other operations at portions of arrayed memory 310 via signal path 303. In addition, although shown as single lines, signal path 303 and/or signal path 306 may be distributed across a plurality of signal lines and/or bus lines.

Arrayed memory 310 includes memory sectors 320 (identified individually as sectors 1-i) that can be accessed via memory controller 330. Memory sectors 320 can include, for example, 256, 512, 1024, 2048 or more sectors having memory cells that can be individually or collectively accessed. In other examples, the number and/or arrangement of memory sectors can be different. In one embodiment, for example, sectors 320 can be referred to more generally as memory blocks and/or can be configured to have a configuration that is different than a bit line, word line, and/or sector topology.

Memory controller 330 includes decoder component 332, voltage generator component 334, and controller component 336. In some embodiments, memory controller 330 may be located on the same chip as arrayed memory 310. In other examples, other implementations of memory controller 330 are possible. For example, memory controller 330 can include a programmable microcontroller.

Decoder component 332 is arranged to receive memory addresses via addressing signal path 306 and to select individual sectors, arrays, or cells according to the architecture of arrayed memory 310.

Decoder component 332 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 310 and another portion (or another grouping of bits) can identify a core cell array within a particular sector.

Voltage generator component 334 is arranged to receive one or more supply voltages (not shown in FIG. 3) and to provide a variety of reference voltages required for reading, writing, erasing, pre-programming, soft programming, and/or under-erase verifying operations. For example, voltage generator component 334 can include one or more cascode circuits, amplifier circuits, regulator circuits, and/or switch circuits that can be controlled by controller component 336.

Controller component 336 is arranged to coordinate reading, writing, erasing, and other operations of memory 300. In one embodiment, controller component 336 is arranged to receive and transmit data from an upstream system controller (not shown). Such a system controller can include, for example, a processor and a static random access memory (SRAM) that can be loaded with executable processor instructions for communicating over signal path 306. In another embodiment, controller component 336 as well as other portions of memory controller 330 may be embedded or otherwise incorporated into a system controller or a portion of a system controller.

Embodiments of controller component 336 can include a state machine and/or comparator circuits. State machine and comparator circuits can include any of a variety of circuits for invoking any of a myriad of algorithms for performing reading, writing, erasing, or other operations of memory 300. State machines and comparator circuits can also include, for example, comparators, amplifier circuits, sense amplifiers, combinational logic, or the like.

In some embodiments, memory 300 is a flash-based memory including flash-based memory cells, such as flash-based NOR cells, NAND cells, or hybrids of the two. In some embodiments, memory 300 is a MirrorBit™ flash memory.

Figure 4:
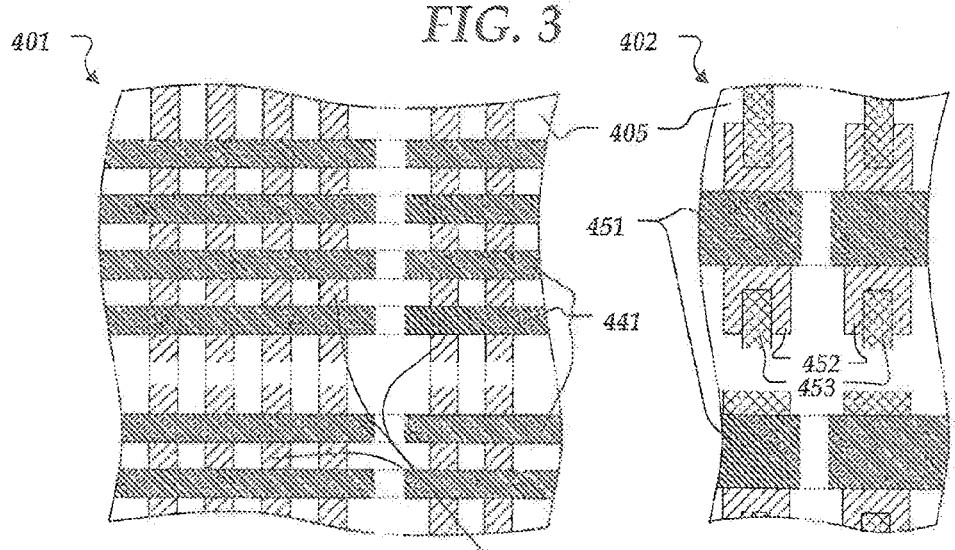
FIG. 4 shows a partial top plan view of an embodiment of core and peripheral sections of a memory that may be employed in an embodiment of the memory of FIG. 3.

FIG. 4 shows a partial top plan view of separate sections of a memory. Core section 401, for example, may be an embodiment of a portion of sector 320 of FIG. 3 and may include arrayed core memory cells. Peripheral section 402, for example, may be an embodiment of memory controller 310 of FIG. 3 or a portion of memory controller 310 of FIG. 3.

Core section 401 includes core polysilicon lines 441, conductive regions 442, and a portion of substrate 405. Portions of core polysilicon lines 441 are coupled to the gates of individual memory cells (not shown in FIG. 4) and can be configured as a word line, a source select gate line, and/or a drain select gate line. Portions of conductive regions 442 can include, for example, p-type and/or n-type doped regions of substrate 405 for forming source/drain regions and/or conductive lines. For example, conductive regions 442 can form portions of bit lines and/or other signal lines. Also, in some embodiments, individual conductive regions 442 extend at least partially underneath individual core polysilicon lines 441.

In one embodiment, core section 401 is arranged in a NOR topology, and individual memory cells can be individually accessed via individual conductive regions 442. In another embodiment, core section 401 is arranged in a NAND topology, and individual memory cells can be accessed though individual conductive regions 442 collectively but not individually. In other embodiments, hybrid architectures can be employed. For example, core section 401 can be configured to have a portion that is NAND-based and another portion that is NOR-based. Also, although not shown if FIG. 4, core section 401 may include any of a variety of interconnect and/or passivation layers, such as dielectric, conductive, or other layers. For example, conductive regions 442 can be positioned beneath a dielectric spacer layer.

Peripheral section 402 includes peripheral polysilicon lines 451, conductive regions 452, and interconnects 453. Portions of peripheral polysilicon lines 451 are coupled to individual peripheral devices (not shown in FIG. 4).

Portions of conductive regions 452 can include, for example, p-type and/or n-type doped regions of substrate 405 for forming conductive features, such as a source, a drain, or other type of well. Interconnects 453 can include conductive lines that electrically intercouple portions of peripheral section 402 and/or electrically couple core section 401 with peripheral section 402. For example, interconnects 453 can include a combination of metal lines and vias. Also, although not shown FIG. 4, peripheral section 402 may also include any of a variety of other interconnect and/or passivation layers.

Figure 5:
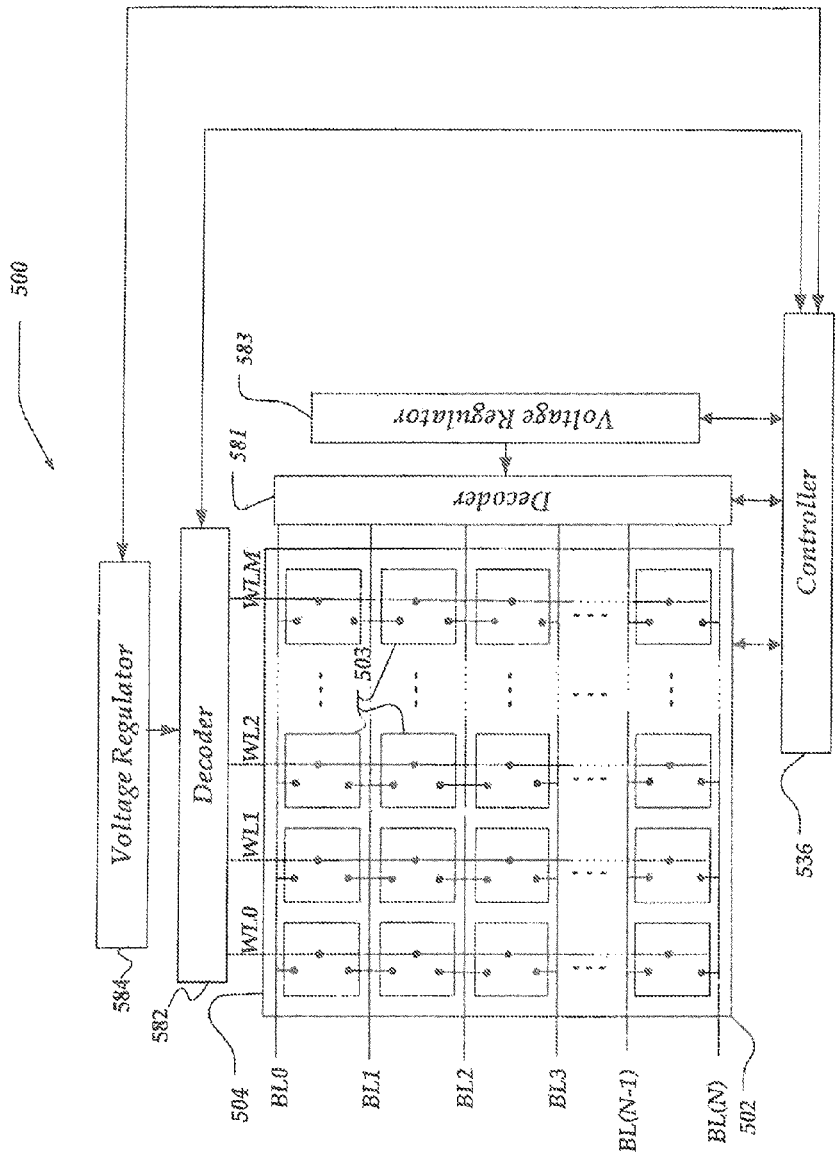
FIG. 5 illustrates a block diagram of an embodiment of a NOR memory array.

FIG. 5 illustrates a block diagram of an embodiment of memory device 500, which may be employed as an embodiment of memory device 300 of FIG. 3. Memory device 500 includes memory array 502 and individual memory cells 503 located within memory array 502. Memory cells 503 are arranged in N+1 rows and M+1 columns in memory array 502. In one embodiment, each row of memory array 502 is accessed by two of the bit lines BL0 to BLN. Each column of memory array 502 is accessed by one of word lines WL0 to WLM. Accordingly, each of memory cells 503 can be accessed by activating the corresponding bit lines and a corresponding word line of the cell. In one embodiment, each column of memory array 502 defines a data word. If N+1 has a value of 8, for example, the cells in each column of memory array 502 define a byte of data.

Memory cells 503 may be flash memory cells which store bits in different ways in different embodiments. In various embodiments, a single cell may store one or more bits. For example, some memory cells are single cell devices, some memory cells are dual cells devices, and in some embodiments, more than one distinct level of threshold voltage may be used to represent more than one bit per cells, as discussed in greater detail below. In some embodiments, flash memory stores information in an array of memory cells made from floating-gate transistors. In, for example, a NOR gate flash, the transistors resemble a standard metal-oxide-semiconductor field-effect transistor ("MOSFET") except that the transistor has two gates, a floating gate and a control gate, instead of one. On top is the control gate ("CG"), as in other metal-oxide-semiconductor transistors, but below this there is a floating gate ("FG") insulated all around by an oxide layer. The FG is interposed between the CG and the MOSFET channel. Because the FG is electrically isolated by an insulating layer, any electrons placed on it are trapped there and, under normal conditions, will not discharge for many years. When the FG holds a charge, it screens (partially cancels) the electric field from the CG, which modifies the threshold voltage ("$V_T$") of the cell. The threshold voltage of a MOSFET is usually defined as the gate voltage where an inversion layer forms at the interface between the insulating layer (oxide) and the substrate (body) of the transistor. During read-out, a voltage is applied to the CG, and the MOSFET channel will become conducting or remain insulating, depending on the $V_T$ of the cell, which is in turn controlled by the charge on the FG. The current flow through the MOSFET channel is sensed which permits a determination of the voltage threshold for the device, which in turn provides information about the binary data stored within the device.

In a single cell device, each control gate of a transistor stores a single charge amount that represents the stored information. In its default or "un-programmed" state, it is logically equivalent to a binary "1" value, because current will flow through the channel under application of an appropriate voltage to the control gate.

In a dual cell device, each control gate stores two charge amounts that represent the stored information. That is, two physically distinct quantities of charge are stored on opposite sides of the floating gate. Reading or writing data on one side of the floating gate occurs independently of the data that is stored on the opposite side of the floating gate. In this technology, the FG is split into two mirrored or complementary parts, each of which is formulated for storing independent information. Each dual cell, like a traditional cell, has a gate with a source and a drain. However, in the dual cell the connections to the source and drain may be reversed in operation to permit the storage of the two bits. Each of the memory cells is comprised of multi-layri. A charge-trapping dielectric layer is formed over a semiconductor substrate. The charge-trapping dielectric layer can generally be composed of three separate layers: a first insulating layer, a charge-trapping layer, and a second insulating layer. Word-lines are formed over the charge-trapping dielectric layer substantially perpendicular to the bit lines. Programming circuitry controls two bits per cell by applying a signal to the word-line which acts as a control gate, and changing bit line connections such that one bit is stored by the source and drain being connected in one arrangement and the complementary bit is stored by the source and drain being connected in another arrangement.

In a single-level cell ("SLC") device, each cell stores only one bit of information, either the cell is "un-programmed" (has a "1" value) or "programmed" (has a "0"value). There also exist multi-level cell ("MLC") devices that can store more than one bit per cell by choosing between multiple levels of electrical charge to apply to the floating gates of its cells. In these devices, the amount of current flow is sensed (rather than simply its presence or absence), to determine more precisely the level of charge on the FG.

As one example, a dual cell device may also be a MLC device that stores four-bits-per-cell so that one transistor equates to 16 different states. This enables greater capacity, smaller die sizes and lower costs for the flash devices.

Memory device 500 further includes controller 536, decoder 581, decoder 582, voltage regulator 583, voltage regulator 584, and charge pump 586.

In some embodiments, voltage regulator 583 is arranged to receive a boosted bit word line voltage from a charge pump 585, and to provide an adjusted boosted bit line voltage based on control from controller 536. Similarly, in some embodiments, voltage regulator 584 is arranged to receive a boosted word line voltage from a charge pump, and to provide an adjusted boosted word line voltage based on control from controller 536. In other embodiments, voltage regulators 583 and 583 may be omitted from memory device 500, and the boosted voltages may be provided directly to the decoders.

Decoder 581 and decoder 582 can each receive address bus information from controller 536 and can utilize such information to facilitate accessing or selecting the desired memory cell(s) (e.g., memory location(s)) associated with the command, and to provide the needed voltages to the bit lines (decoder 581) and the word lines (decoder 582) according to timing that is controlled by controller 536.

Decoder 581 may also include a sector decoder in some embodiments. As such, decoder 509 may be arranged to facilitate accessing or selection particular column or grouping of columns within memory device 500. For example, a grouping of columns may define a sector, and another grouping of columns may define another sector. In another embodiment, portion 501 may include an array decoder for to a particular memory array 504. In addition, embodiments of array decoders can be configured to work separately or in conjunction with a sector decoder.

Memory controller 536 is also configured to control the activation and de-activation of individual word lines WL0 to WLM for reading, writing, and/or erasing to memory array 502. For example, memory controller 510 can provide a select signal to decoder 582 to select one of the columns WL1 to WLM to activate that column. Further, memory controller 536 can provide a select signal to decoder 581 for selecting particular rows BL0 to BLN (or sector) to be written to or read from.

Figure 6:
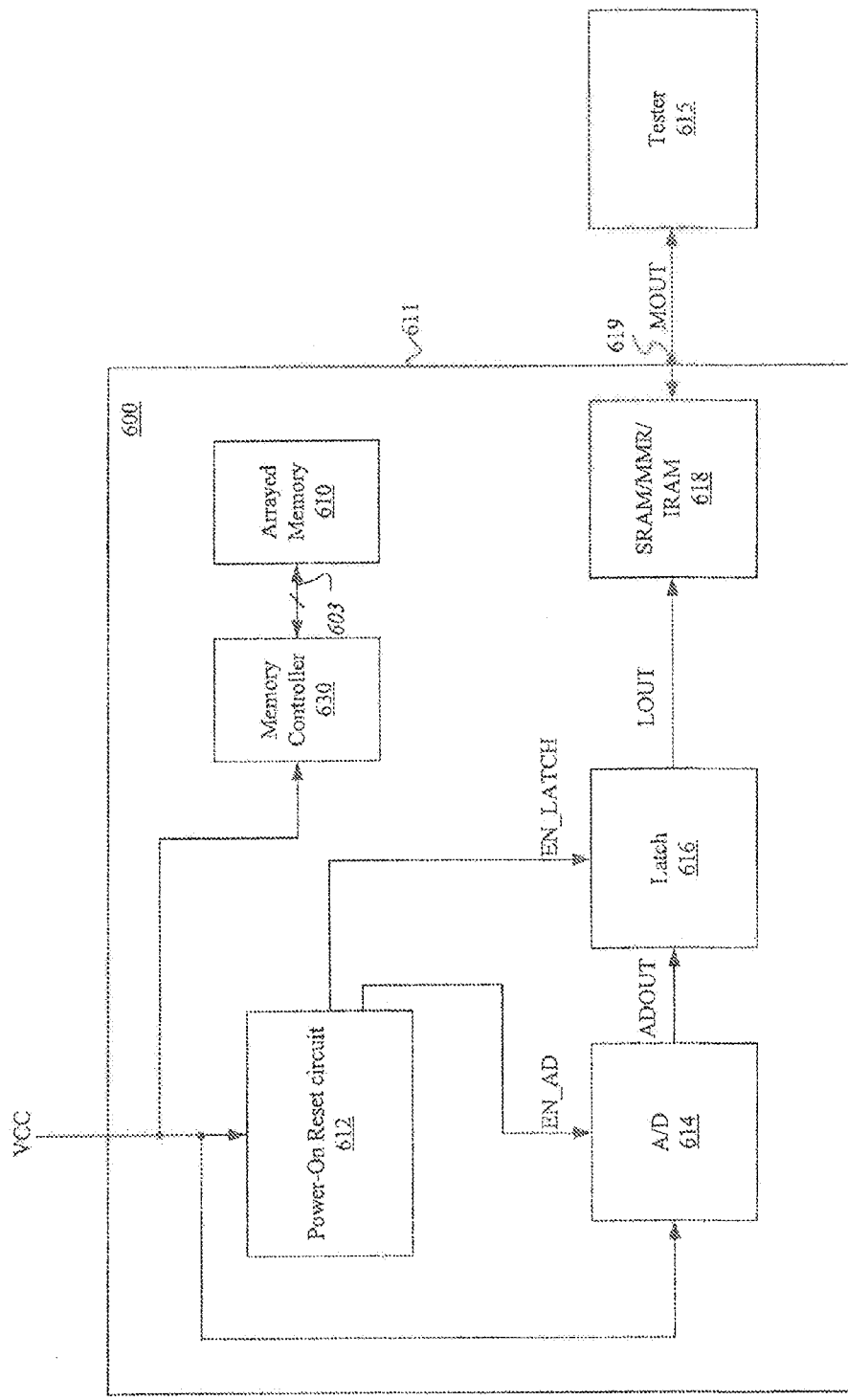
FIG. 6 shows a block diagram of an embodiment of the integrated circuit of FIG. 2 and an embodiment of a tester.

FIG. 6 shows a block diagram of an embodiment of tester 615 and integrated circuit 611, which may be employed as an embodiment of integrated circuit 211 of FIG. 2. Power-on reset circuit 612 is an embodiment of comparison circuit 212 of FIG. 2. Synchronous random access memory (SRAM)/memory-mapped register (MMR)/intelligent random access memory (IRAM) 618 is an embodiment of storage component 218 of FIG. 2.

Integrated circuit 611, in conjunction with tester 615, may be used for accurate VCC trip point measurement on silicon across even slow or fast VCC ramp rates, for use in testing, characterization, debugging, and the like. For example, the VCC trip point measurement may be used in design engineering (DE) debugging, product engineering (PE) characterization, and/or testing in production sort and final test of the device. The VCC trip point measurement may be useful in replicating customer VCC ramp issues, speeding up otherwise time-consuming VCC trip point debugging since no silicon probing is required, and avoiding long VCC trip point measurements in PE characterization, and eliminating the dependence of environment on set-up.

The VCC trip point is the minimum voltage level to "wake up" a device during power-up and start the power-on read (POR) operation before reaching the minimum VCC operating level. In general, VCC trip point is the minimum voltage level to "wake-up" a device and start the power-on operation and thus, VCC trip point is lower than the minimum VCC voltage range that is guaranteed in the marketing specification. In some circuits, the VCC trip point may be adjustable by trimming such as resistor trimming.

A/D converter circuit 614 and latch 616 are enabled at a "VCCOK low" trip point. Shortly after the "VCCOK low" trip point that enables A/D converter circuit 614 and latch 616, all latches in latch 616 are shut off by a "VCCOK high" trip point, where "VCCOK high" is the actual VCC trip point.

The VCC trip point is stored in SRAM/MMR/IRAM 618. SRAM/MMR/IRAM 618 has a data-access mode that can be initiated by tester 615. During data-access mode, SRAM/MMR/IRAM outputs the VCC trip point, which can then be read by tester 615, so that tester 615 directly reads the VCC trip point value out of SRAM/MMR/IRAM 618 during the data-access mode.

Figure 7:
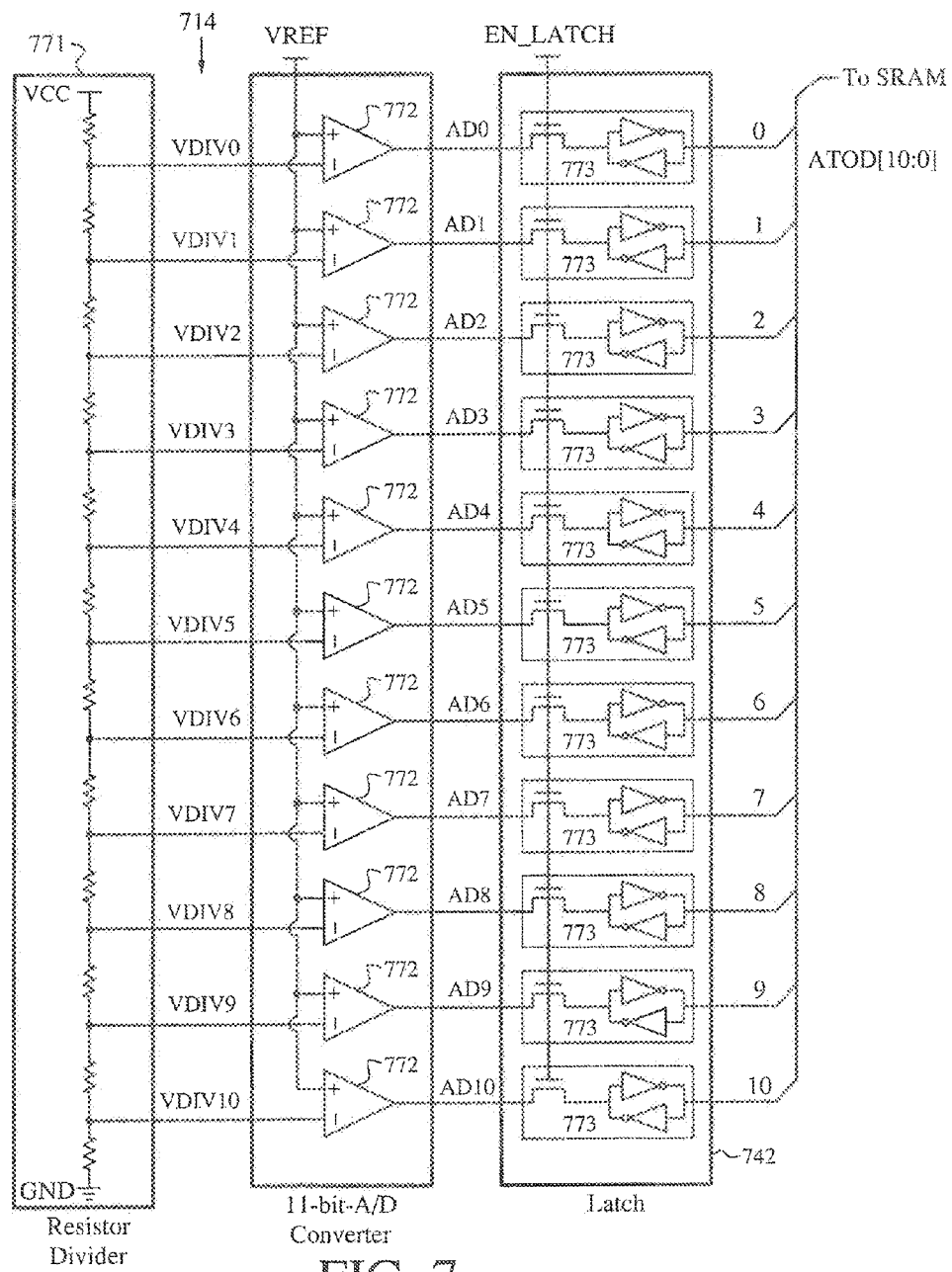
FIG. 7 schematically illustrates an embodiment of the A/D converter and latch of FIG. 6.

FIG. 7 schematically illustrates an embodiment of the A/D converter 714 and latch 716, which may be employed as embodiments of A/D converter 614 and latch 716, respectively, of FIG. 6. A/D converter 714 includes resistor divider chain 671 and comparators 772. Latch 742 includes a number of latches 773, one for each bit of the A/D converter.

Resistor divider chain 771 is a resistance chain sourced by power supply signal VCC which generates resistor divided voltage VDIV. Comparators 772 compare the resistor divided voltage, VDIV, with reference voltage VREF, to provide signal AD. If VDIV is below VREF level, AD will flip to high. In some embodiments, reference voltage VREF may be provided by a bandgap reference voltage, or the like.

When VCC is tripped, EN_LATCH will latch in AD[10:0] information (which is in turn stored by SRAM/MMR/IRAM 618 of FIG. 6). Signal AD[10:0] is an embodiment of signal ADOUT. In some embodiments, step resolution can be divided into two for minimizing area size usage, such as 2.45V~2.65V in 25 mV per division, and 2.40V~2.45V and 2.65V~2.70V in 50 mV per division. Although FIG. 7 illustrates an eleven-bit A/D converter, the invention is not so limited, and a different suitable number of bits may be employed, depending on the desired resolution, and/or the like.

Figure 8:
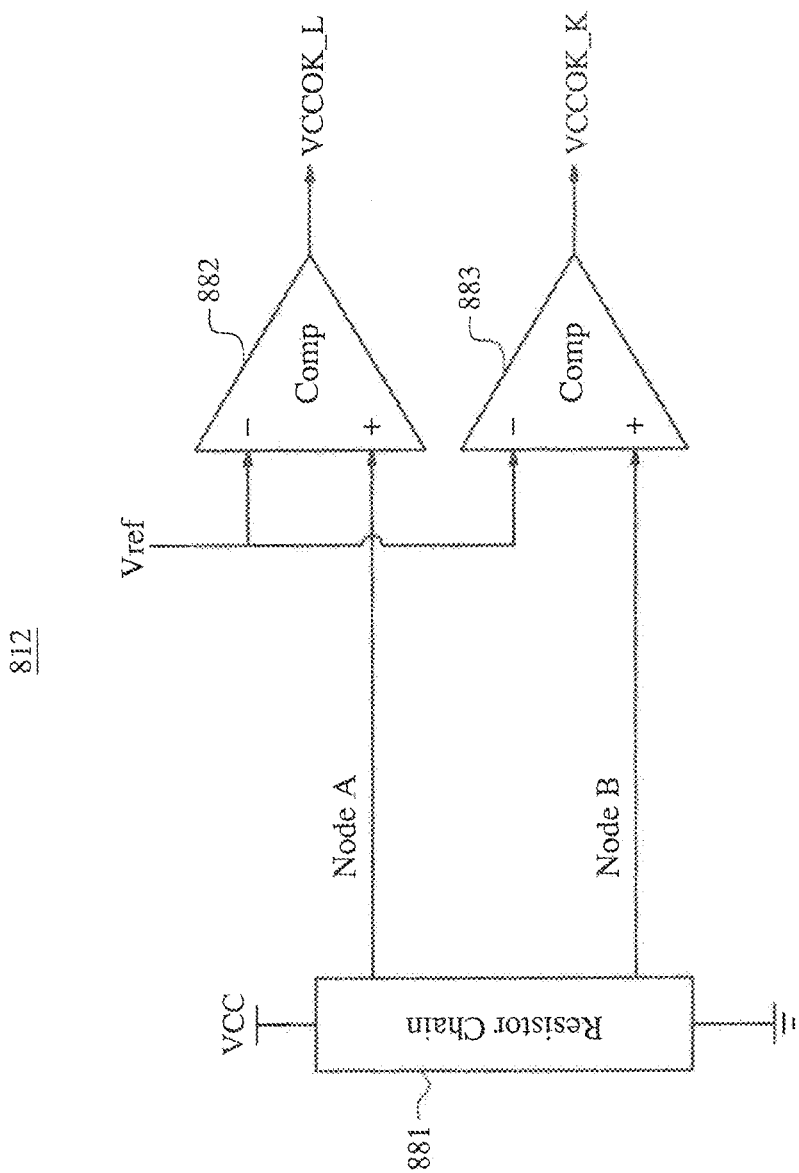
FIG. 8 shows a block diagram of an embodiment of a portion of the Power-on reset circuit of FIG. 6.

FIG. 8 shows a block diagram of an embodiment of a portion power-on reset circuit 812, which may be employed as an embodiment of power-on reset circuit 612 of FIG. 6. Power-on reset circuit 812 includes resistor chain 881, comparator 882, and comparator 883. Resistor chain 881 has a node A and a node B. The voltage at node A has a slightly faster ramp than node B when VCC is ramping up. In some embodiments, the node A and node B resistance divided voltages are trimmable. Comparator 882 is arranged to compare reference voltage Vref with the voltage at node A to provide signal VCCOK_L, which is an embodiment of signal EN_AD, and comparator 883 is arranged to compare voltage reference Vref with the voltage at node V to provide signal VCCOK_H.

Figure 9:
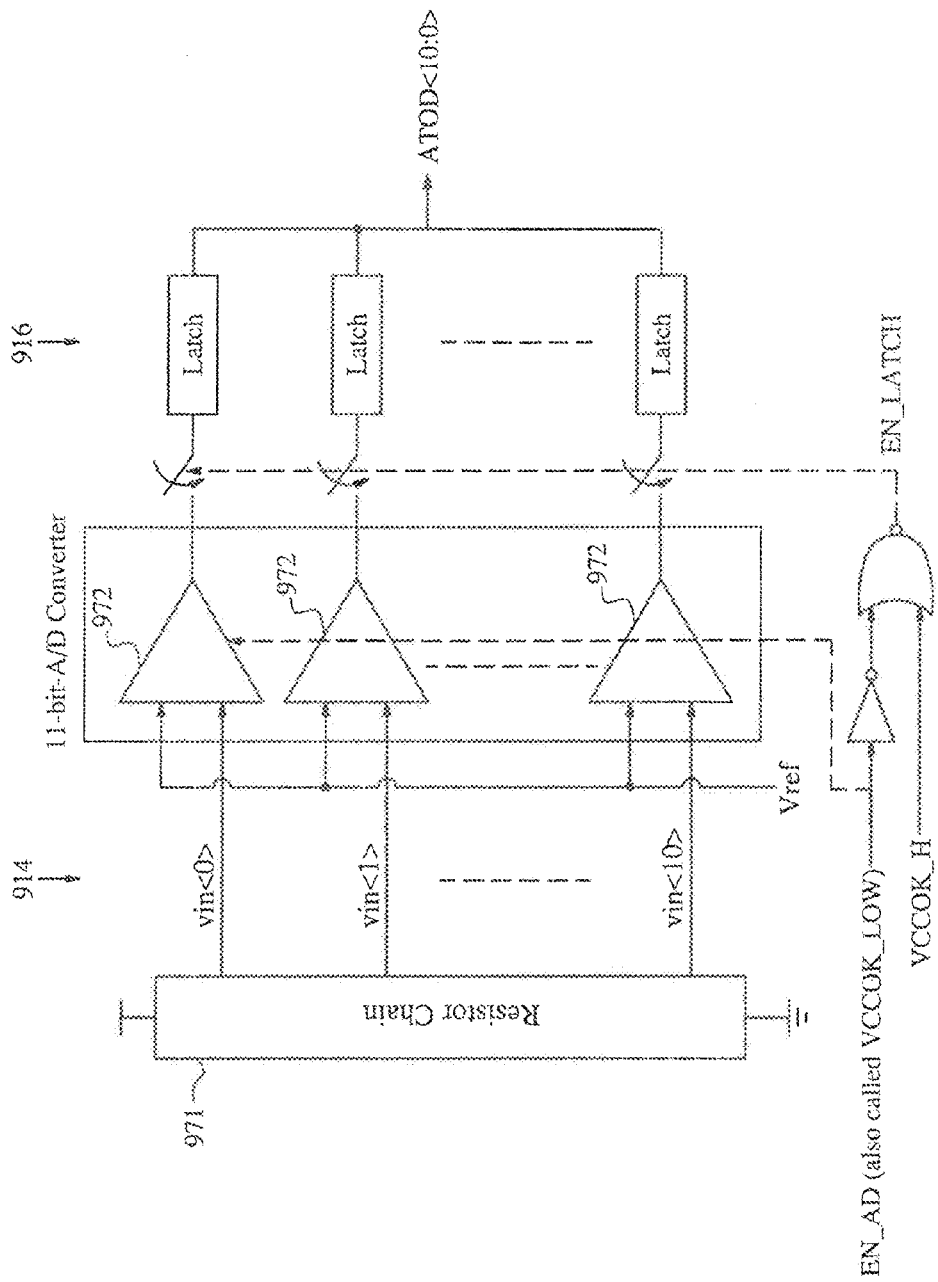
FIG. 9 illustrates a block diagram of an embodiment of the A/D converter and latch of FIG. 7.

FIG. 9 illustrates a block diagram of an embodiment of A/D converter 914 and latch 916, which may be employed as embodiments of A/D converter 714 and latch 716 of FIG. 7. The circuitry further includes an inverter and a NOR gate. Signal EN_AD (which may be provided as signal VCCOK_L of FIG. 8 in some embodiments), is employed to enable the comparators 972 in A/D converter 914. Signal EN_Latch is employed to open and close switches in between the comparators in the latches, as shown, where signal EN_LATCH is provided by the logic illustrated.

Figure 10:
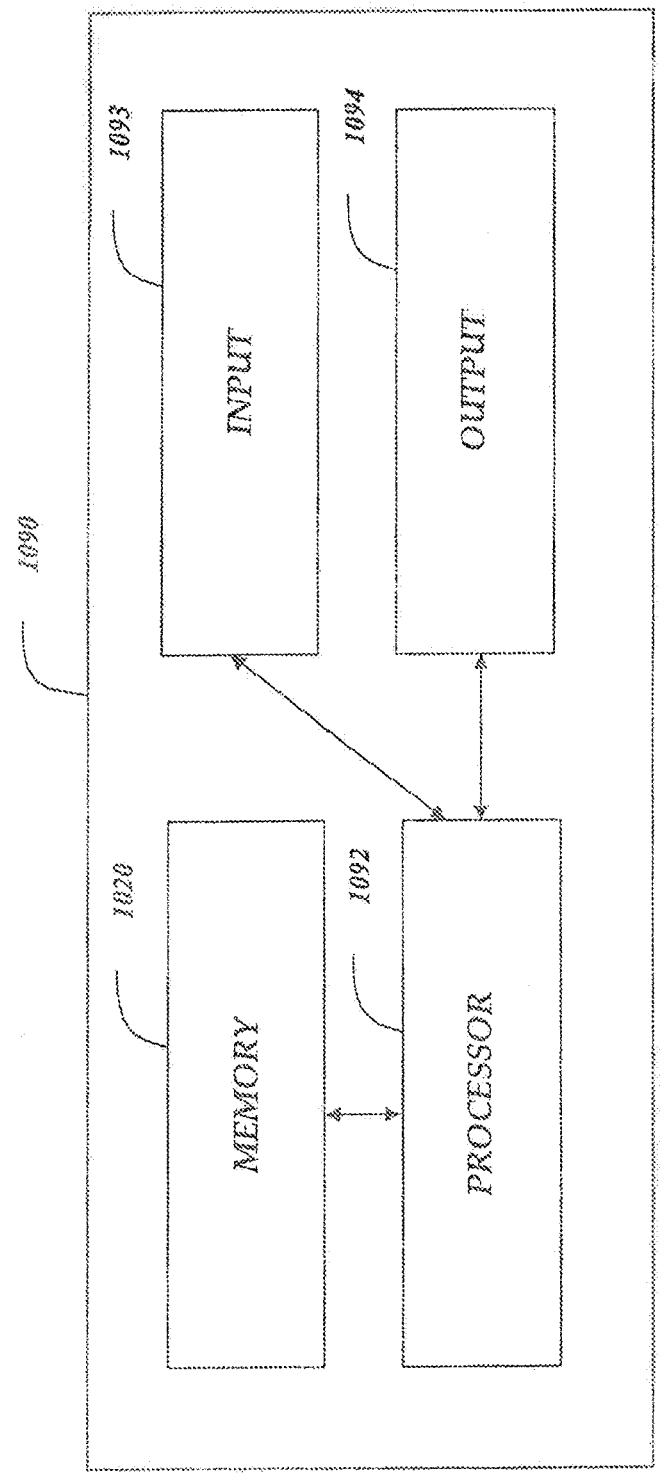
FIG. 10 illustrates a block diagram of an embodiment of a system that includes the memory device of FIG. 2, in accordance with aspects of the invention.

Embodiments of the memory device can be incorporated into any of a variety of components and/or systems, including for example, a processor and other components or systems of such components. FIG. 10 shows one embodiment of system 1090, which may incorporate memory 1020, which is an embodiment of memory device 200 of FIG. 2. Memory 1020 can be directly or indirectly connected to any one of processor 1092, input devices 1093, and/or output devices 1094. In one embodiment, memory 1020 may be configured such that it is removable from system 1090. In another embodiment, memory 1020 may be permanently connected to the components or a portion of the components of system 1090.

In many embodiments, memory 1020, processor 1092, input devices 1093, and/or output devices 1094 of system 1090 are configured in combination to function as part of a larger system. For example, system 1090 may be incorporated into a cell phone, a handheld device, a laptop computer, a personal computer, and/or a server device. In addition or alternatively, system 1090 can perform any of a variety of processing, controller, and/or data storage functions, such as those associated with sensing, imaging, computing, or other functions. Accordingly, system 1090 can be incorporated into any of a wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. An apparatus comprising:
   a comparison circuit configured to compare a power supply voltage to a reference voltage and to output an enable signal at a trip point of the comparison circuit;
   an analog-to-digital converter (ADC) configured to convert an analog value of the power supply voltage to a digital value representative of the power supply voltage when the ADC receives the enable signal;
   a storage component; and
   a latch circuit configured to pass the digital value to the storage component.

2. The apparatus of claim 1, wherein the comparison circuit comprises a first comparator configured to output the enable signal and a second comparator configured to output a disable signal.

3. The apparatus of claim 2, wherein the ADC comprises an ADC output and is configured to de-activate the ADC output after receiving the disable signal.

4. The apparatus of claim 2, wherein the comparison circuit comprises a resistor chain, and wherein a first timing associated with the enable signal and a second timing associated with the disable signal are adjusted using the resistor chain.

5. The apparatus of claim 1, wherein the ADC comprises:
   a resistor chain;
   a plurality of comparators, wherein a first input to each of the plurality of comparators is coupled to the resistor chain and a second input to each of the plurality of comparators is coupled to a reference voltage;
   a plurality of latches respectively coupled to the plurality of comparators, wherein outputs of the plurality of latches are coupled to form an ADC output; and
   a plurality of switches respectively coupling the plurality of comparators to the plurality of latches, wherein the plurality of switches is closed when the ADC receives the enable signal.

6. The apparatus of claim 1, wherein the storage component comprises a non-volatile memory device.

7. The apparatus of claim 6, wherein the non-volatile memory device comprises a Flash memory device.

8. The apparatus of claim 1, wherein the latch circuit is configured to open after receiving the enable signal and to continue to pass the digital value to the storage component while the latch circuit receives the enable signal.

9. A method comprising:
   outputting an enable signal at a trip point of a comparison circuit;
   converting, with an analog-to-digital converter (ADC), an analog value of a power supply voltage to a digital value representative of the power supply voltage when the ADC receives the enable signal; and
   passing, with a latch circuit, the digital value to a storage component.

10. The method of claim 9, further comprising:
    outputting a disable signal to de-activate an ADC output, wherein the disable signal is issued after a predetermined amount of time from when the enable signal is issued.

11. The method of claim 10, wherein the outputting the enable and disable signals comprise adjusting, with a resistor chain, a first timing associated with the enable signal and a second timing associated with the disable signal.

12. The method of claim 9, wherein the passing comprises storing the digital value in a non-volatile memory device.

13. The method of claim 9, wherein the passing comprises:
    opening the latch circuit after receipt of the enable signal by the latch circuit; and
    continuously passing, with the latch circuit, the digital value to the storage component while the latch circuit receives the enable signal.

14. A system comprising:
    an integrated circuit (IC) comprising:
        a comparison circuit configured to compare a power supply voltage to a reference voltage and to output an enable signal at a trip point of the comparison circuit;
        an analog-to-digital converter (ADC) configured to convert an analog value of the power supply voltage to a digital value representative of the power supply voltage when the ADC receives the enable signal;
        a storage component; and
        a latch circuit configured to pass the digital value to the storage component; and
    a tester device coupled to the IC and configured to receive the digital value from the IC.

15. The system of claim 14, wherein the tester device is configured to read the digital value from the storage component during a data access mode of operation.

16. The system of claim 14, wherein the comparison circuit comprises a first comparator configured to output the enable signal and a second comparator configured to output a disable signal.

17. The system of claim 16, wherein the ADC comprises an ADC output and is configured to de-activate the ADC output after receiving the disable signal.

18. The system of claim 16, wherein the comparison circuit comprises a resistor chain, and wherein a first timing associated with the enable signal and a second timing associated with the disable signal are adjusted using the resistor chain.

19. The system of claim 14, wherein the storage component comprises a non-volatile memory device.

20. The system of claim 14, wherein the latch circuit is configured to open after receiving the enable signal and to continue to pass the digital value to the storage component while the latch circuit receives the enable signal.

* * * * *